(12) United States Patent
Coskun et al.

(10) Patent No.: US 9,305,800 B2
(45) Date of Patent: Apr. 5, 2016

(54) METHODS FOR FABRICATING INTEGRATED CIRCUITS USING DIRECTED SELF-ASSEMBLY INCLUDING LITHOGRAPHICALLY-PRINTABLE ASSIST FEATURES

(71) Applicant: GLOBALFOUNDRIES, Inc., Grand Cayman (KY)

(72) Inventors: Tamer Coskun, San Jose, CA (US); Wei-Long Wang, Clifton Park, NY (US); Azat Latypov, San Jose, CA (US); Yi Zou, Foster City, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 36 days.

(21) Appl. No.: 14/185,491

(22) Filed: Feb. 20, 2014

(65) Prior Publication Data
US 2015/0235839 A1 Aug. 20, 2015

(51) Int. Cl.
*H01L 21/308* (2006.01)
*H01L 21/027* (2006.01)

(52) U.S. Cl.
CPC ........ *H01L 21/3086* (2013.01); *H01L 21/0274* (2013.01); *H01L 21/308* (2013.01)

(58) Field of Classification Search
CPC ...... C30B 19/12; G03F 7/0002; B82Y 40/00; B82Y 10/00; H01L 21/31138; H01L 21/02334; H01L 21/0271; H01L 21/31111
USPC .................................. 438/703, 702, 725, 761
See application file for complete search history.

(56) References Cited

U.S. PATENT DOCUMENTS

2010/0294740 A1 11/2010 Cheng et al.
2011/0147985 A1* 6/2011 Cheng et al. .................. 264/225

OTHER PUBLICATIONS

Wikipedia contributors, "Copolymer", Wikipedia, The Free Encyclopedia, http://en.wikipedia.org/w/index.php?title=Copolymer &oldid=457198836 (accessed Nov. 15, 2011).
Latypov et al., "Exploration of the directed self-assembly based nano-fabrication design space using computational simulations," Alternative Lithographic Technologies, Proc. of SPIE vol. 8680 868013-1, 2013.
U.S. Appl. No. 14/072,149, filed Nov. 5, 2013.

* cited by examiner

*Primary Examiner* — Evan Pert
*Assistant Examiner* — Changhyun Yi
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes forming assisting etch resistant fill topographical features that overlie a semiconductor substrate and that define an assisting etch resistant fill confinement well using a photomask. The photomask defines an assisting lithographically-printable mask feature. A block copolymer is deposited into the assisting etch resistant fill confinement well. The block copolymer is phase separated into an etchable phase and an etch resistant phase. The assisting etch resistant fill topographical features direct the etch resistant phase to form an etch resistant plug in the assisting etch resistant fill confinement well.

20 Claims, 7 Drawing Sheets

METHODS FOR FABRICATING INTEGRATED CIRCUITS USING DIRECTED SELF-ASSEMBLY INCLUDING LITHOGRAPHICALLY-PRINTABLE ASSIST FEATURES

TECHNICAL FIELD

The technical field relates generally to methods for fabricating integrated circuits, and more particularly relates to methods for fabricating integrated circuits with an improved process window for directed self-assembly.

BACKGROUND

Decreasing device size and increasing device density has traditionally been a high priority for the manufacturing of integrated circuits. Optical lithography has been the driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique which aligns self-assembling polymeric materials on a lithographically defined guide pattern, is a potential option for extending current optical lithography beyond its pitch and resolution limits. The self-assembling materials, for example, are block copolymers (BCPs) that consist of "A" homopolymer covalently attached to "B" homopolymer, which are coated over a lithographically defined guide pattern on a semiconductor substrate. The lithographically defined guide pattern is a pre-pattern that is encoded with spatial chemical and/or topographical information and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the guide pattern. Then, by removing either the A polymer region or the B polymer region by wet chemical or plasma-etch techniques, a mask is formed for transferring the nanopattern to the underlying substrate.

One DSA technique is graphoepitaxy in which self-assembly is directed by topographical features that are formed overlying a semiconductor substrate. This technique is used, for example, to create contact holes or vias that can be subsequently filled with conductive material for forming electrical connections between one or more layers of the semiconductor substrate. In particular, the topographical features are formed overlying the semiconductor substrate using a photomask that defines mask features and conventional lithographic techniques to transfer the mask features to a photoresist layer that overlies the semiconductor substrate to form a patterned photoresist layer. The pattern photoresist layer is then selectively etched to form the topographical features that define confinement wells. The confinement wells are filled with a BCP that is subsequently phase separated to form, for example, etchable cylinders or other etchable features that are each formed of either the A polymer region or the B polymer region of the BCP. The etchable cylinders are removed to form openings and define a mask for etch transferring the openings to the underlying semiconductor substrate.

Unfortunately, current techniques for forming DSA patterns can have considerable process variations that reduce the DSA process window (DSAPW). The DSAPW is defined as the total process variation for creating the DSA patterns including any process variations from lithographically transferring the mask features from a photomask to etch transferring the DSA pattern to the underlying semiconductor substrate. One approach to improving the DSAPW is to improve the lithographic process window for transferring the mask features from the photomask to the photoresist layer. In conventional lithography, non-printing lithographic assist features may be arranged on a photomask about a main feature that is intended to be transferred to the photoresist layer. These non-printing lithographic assist features help improve the process window by reducing the sensitivity to lithographic process variations, such as variations of dose and focus. The size of these non-printing lithographic assist features is relatively small such that they do not print or transfer to the photoresist layer and otherwise produce unintended features being subsequently formed in the integrated circuit. Unfortunately, the relatively small size of these non-printing lithographic assist features limits their benefit to improving the lithographic process window.

Accordingly, it is desirable to provide methods for fabricating integrated circuits with an improved process window for directed self-assembly. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming assisting etch resistant fill topographical features that overlie a semiconductor substrate and that define an assisting etch resistant fill confinement well using a photomask. The photomask defines an assisting lithographically-printable mask feature. A block copolymer is deposited into the assisting etch resistant fill confinement well. The block copolymer is phase separated into an etchable phase and an etch resistant phase. The assisting etch resistant fill topographical features direct the etch resistant phase to form an etch resistant plug in the assisting etch resistant fill confinement well.

In accordance with another exemplary embodiment, a method for fabricating an integrated circuit is provided. The method includes lithographically transferring a DSA directing lithographically-printable mask feature and an assisting lithographically-printable mask feature from a photomask to a photoresist layer that overlies a semiconductor substrate for correspondingly forming graphoepitaxy DSA directing features and assisting etch resistant fill topographical features. The graphoepitaxy DSA directing features define a graphoepitaxy DSA directing confinement well and the assisting etch resistant fill topographical features define an assisting etch resistant fill confinement well. The graphoepitaxy DSA directing confinement well is filled with a first quantity of a block copolymer. The assisting etch resistant fill confinement well is filled with a second quantity of the block copolymer. The first quantity of the block copolymer is phase separated into a first etchable phase and a first etch resistant phase. The graphoepitaxy DSA directing features direct the first etchable phase to extend longitudinally substantially through the graphoepitaxy DSA directing confinement well. The second quantity of the block copolymer is phase separated into a second etchable phase and a second etch resistant phase. The assisting etch resistant fill topographical features direct the second etch resistant phase to obstruct the second etchable phase from extending longitudinally substantially through the assisting etch resistant fill confinement well.

In accordance with another exemplary embodiment, a method for fabricating an integrated circuit is provided. The method includes patterning a photoresist layer that overlies a semiconductor substrate using a photomask that defines a DSA directing lithographically-printable mask feature. The patterned photoresist layer is selectively etched to form a plurality of topographical features including graphoepitaxy DSA directing features that lithographically correspond to the DSA directing lithographically-printable mask feature and side-lobe etch resistant fill topographical features. The graphoepitaxy DSA directing features define a graphoepitaxy DSA directing confinement well and the side-lobe etch resistant fill topographical features define a side-lobe etch resistant fill confinement well. A block copolymer is deposited into the graphoepitaxy DSA directing confinement well and the side-lobe etch resistant fill confinement wells. The block copolymer is phase separated into an etchable phase and an etch resistant phase. The side-lobe etch resistant fill topographical features direct the etch resistant phase to form an etch resistant plug in the side-lobe etch resistant fill confinement well and the graphoepitaxy DSA directing features direct the etchable phase to extend longitudinally substantially through the graphoepitaxy DSA directing confinement well.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
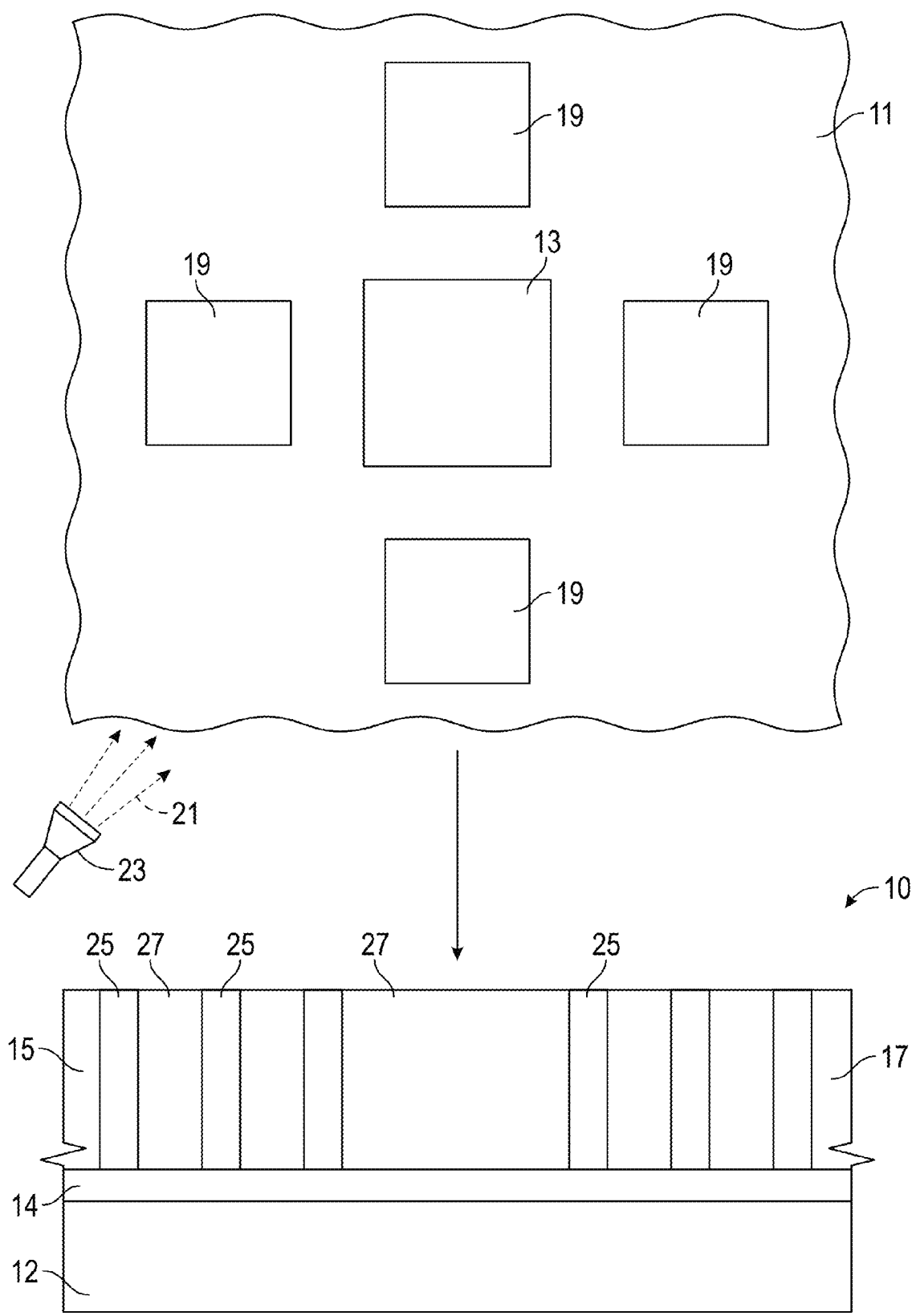
FIG. 1 illustrates, in cross-sectional view, an integrated circuit during an intermediate fabrication stage and, in top view, a photomask in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein provide a photomask that defines a DSA directing lithographically-printable mask feature and an assisting lithographically-printable mask feature. In particular, the DSA directing lithographically-printable mask feature is a main mask feature that is sized to be lithographically printed to a photoresist layer for subsequent DSA processing to form a device feature in the integrated circuit, e.g., hole, via, contact, or the like. The assisting lithographically-printable mask feature is an assist mask feature that is sufficiently sized to be printed into the photoresist layer for improving the lithographic process window but, as will be discussed in further detail below, will not form a device feature in the integrated circuit by subsequent DSA processing.

In an exemplary embodiment, using conventional lithographic techniques, the DSA directing lithographically-printable mask feature and the assisting lithographically-printable mask feature are lithographically transferred from the photomask to a photoresist layer that overlies a semiconductor substrate to form a patterned photoresist layer. The patterned photoresist layer is selectively etched to form a plurality of topographical features including graphoepitaxy DSA directing features that lithographically correspond to the DSA directing lithographically-printable mask feature and an assisting etch resistant fill topographical features that lithographically correspond to the assisting lithographically-printable mask feature. The graphoepitaxy DSA directing features define a graphoepitaxy DSA directing confinement well and the assisting etch resistant fill topographical features define an assisting etch resistant fill confinement well.

In an exemplary embodiment, the graphoepitaxy DSA directing confinement well is filled with a first quantity of a block copolymer and the assisting etch resistant fill confinement well is filled with a second quantity of the block copolymer. The first quantity of the block copolymer is phase separated into a first etchable phase and a first etch resistant phase. In particular, the graphoepitaxy DSA directing features direct the first etchable phase to extend longitudinally substantially through the graphoepitaxy DSA directing confinement well. The second quantity of the block copolymer is phase separated into a second etchable phase and a second etch resistant phase. In particular, the assisting etch resistant fill topographical features direct the second etch resistant phase to obstruct the second etchable phase from extending longitudinally substantially through the assisting etch resistant fill confinement well by forming an etch resistant plug.

In an exemplary embodiment, the block copolymer is etched to remove the first etchable phase from the graphoepitaxy DSA directing confinement well to form a first opening while the etch resistant plug in the assisting etch resistant fill confinement well obstructs etching of the second quantity of the block copolymer to prevent forming an opening through the assisting etch resistant fill confinement well to define an etch mask. Using the etch mask, a second opening is etched into the semiconductor substrate aligned with the first opening in the graphoepitaxy DSA directing confinement well while a portion of the semiconductor substrate underlying the assisting etch resistant fill confinement well is covered by the etch resistant plug and therefore, is not etched. As such, a device feature such as a via or contact can be formed in the second opening, which corresponds to the DSA directing lithographically-printable mask feature on the photomask, while the assisting lithographically-printable mask feature does not subsequently result in any sort of device feature. It has been found that by using a photomask with an assisting lithographically-printable mask feature, which are sufficiently sized to lithographically printed, the lithographic process window, e.g., dose and focus, for lithographically transferring the DSA directing lithographically-printable mask feature to the photomask for forming a device feature by DSA is improved, thereby improving the DSAPW, without forming any unintended device features in the integrated circuit from the assist features.

FIGS. 1-11 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

FIG. 1 illustrates, in cross-sectional view, the integrated circuit 10 during an intermediate fabrication stage and, in top view, a photomask 11 in accordance with an exemplary embodiment. As illustrated, the integrated circuit (IC) 10 includes a semiconductor substrate 12. The semiconductor substrate 12 can be, for example, a bulk semiconductor substrate, silicon-on-insulator (SOI) semiconductor substrate, or any other semiconductor layer or layers overlying a bulk semiconductor substrate, or a SOI semiconductor substrate.

Overlying the semiconductor substrate 12 is a neutral brush layer 14. In an exemplary embodiment, the neutral brush layer 14 includes a random copolymer that has no preferential affinity for the individual polymeric block components of a block copolymer that will be subsequently deposited over the neutral brush layer 14 as part of a DSA process as will be discussed in further detail below. In one example, the neutral brush layer 14 is formed of a polystyrene-(random)-polymethylmethacrylate (PS-r-PMMA) copolymer brush that produces a neutral surface. In an exemplary embodiment, the neutral brush layer 14 has a thickness of from about 5 to about 10 nm. The neutral brush layer 14 may be formed, for example, by depositing a random copolymer onto the semiconductor substrate 12 using a spin coating process.

Although not illustrated, an anti-reflective coating, which is well known in the art and commonly referred to as ARC or BARC (bottom anti-reflective coating), may be optionally disposed between the semiconductor substrate 12 and the neutral brush layer 14. The ARC or BARC helps to absorb and/or control light to dampen or eliminate light reflection during photolithography to improve the photolithography process window for producing smaller features.

Overlying the neutral brush layer 14 is a photoresist layer 15 that has been patterned using the photomask 11 using a conventional lithographic process, e.g., optical, ultraviolet (UV), extreme ultraviolet (EUV), direct ultraviolet (DUV) or the like, to form a patterned photoresist layer 17. In particular, the photomask 11 defines a DSA directing lithographically-printable mask feature 13 and assisting lithographically-printable mask features 19 that are arranged about the DSA directing lithographically-printable mask feature 13. As will be explained in further detail below, the DSA directing lithographically-printable mask feature 13 is a main mask feature that is sized to be lithographically printable for subsequent DSA processing for forming a device feature and the assisting lithographically-printable mask features 19 are assist mask features sufficiently sized to be lithographically printable to improve the lithographic process window without forming a device feature via subsequent DSA processing.

In an exemplary embodiment, a light 21 from a light source 23, such as an optical, UV, EUV, or DUV light source, for example a DUV light source, is directed to the photomask 11 to transfer the DSA directing lithographically-printable mask feature 13 and the assisting lithographically-printable mask features 19 to the photoresist layer 15 to form the patterned photoresist layer 17. The patterned photoresist layer 17 has areas 25 and 27 that correspond to exposed and unexposed areas of the photoresist layer 15, respectively, or vice versa depending upon the particular lithographic technique being employed.

Figure 2:
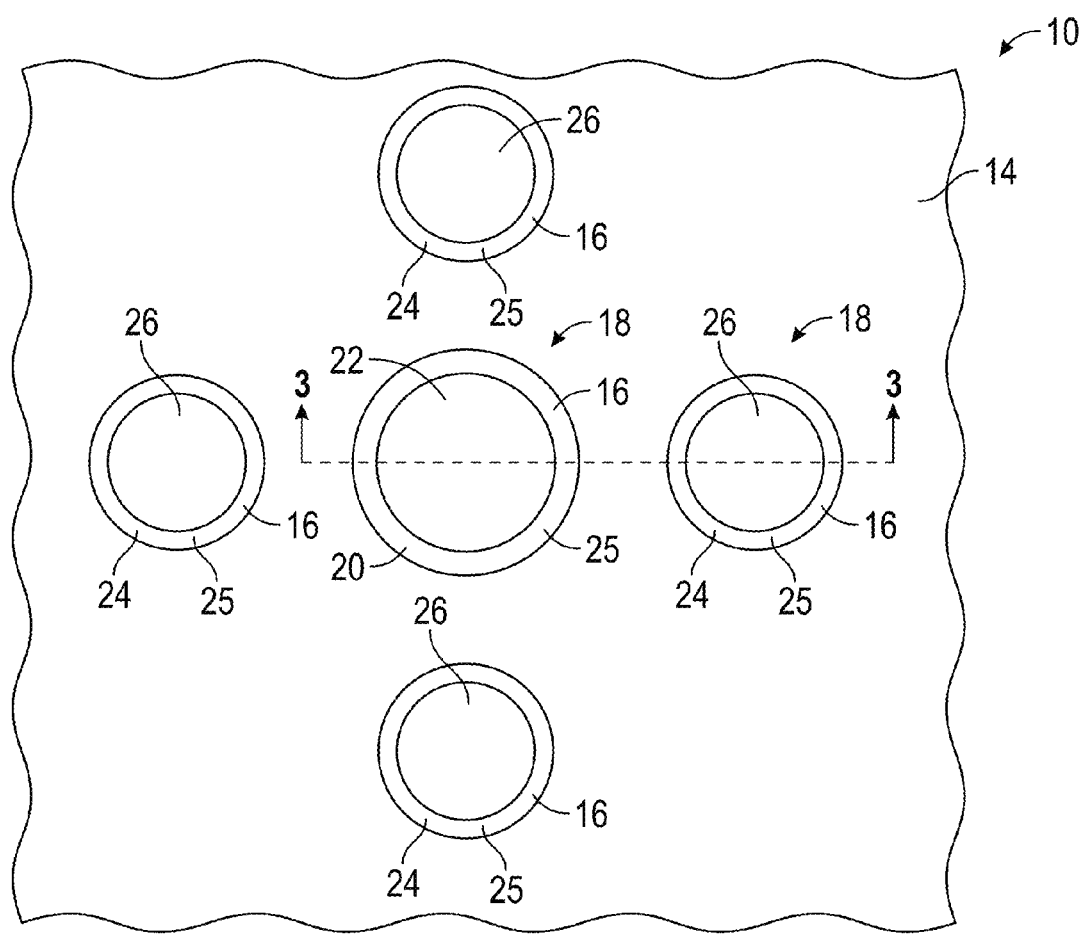
FIG. 2 illustrates, in top view, an integrated circuit during a further advanced fabrication stage in accordance with an exemplary embodiment.
Figure 3:
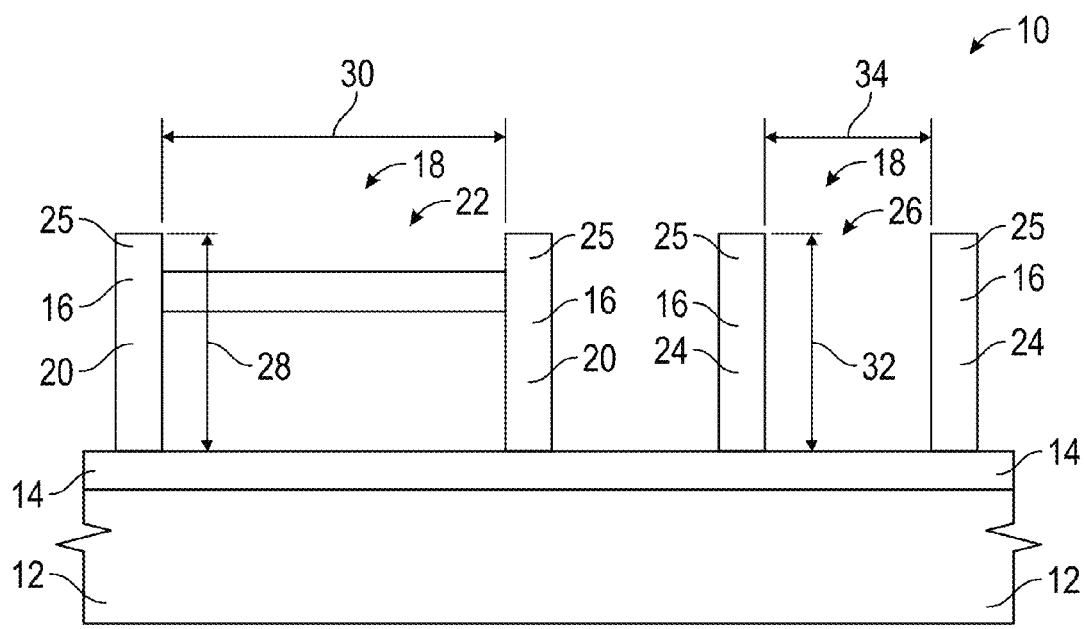
FIG. 3 illustrates, in cross-sectional view, the integrated circuit depicted in FIG. 2.

The process continues by selectively etching the patterned photoresist layer 17 using for example conventional etching techniques, such as a wet or dry etching process, to remove areas 27 while leaving areas 25 substantially intact overlying the neutral brush layer 14 and the semiconductor substrate 12 as illustrated in FIGS. 2-3. With further reference to FIGS. 2-3, in an exemplary embodiment, the areas 25 form topographical features 16 that define confinement wells 18. The topographical features 16 include graphoepitaxy DSA directing features 20 that define a graphoepitaxy DSA directing confinement well 22 and assisting etch resistant fill topographical features 24 that define assisting etch resistant fill confinement wells 26. The graphoepitaxy DSA directing confinement well 22 lithographically corresponds to the DSA directing lithographically-printable mask feature 13 and the assisting etch resistant fill confinement wells 26 lithographically correspond to the assisting lithographically-printable mask features 19. As illustrated, the mask features 13 and 19 have polynomial shapes defined on the photomask 11 (shown in FIG. 1) and due to the lithographic process are transferred to the integrated circuit 10 to define the confinement wells 18 (shown in FIG. 2) having curved or circular shapes.

As will be explained in further detail below, the graphoepitaxy DSA directing features 20 and the corresponding graphoepitaxy DSA directing confinement well 22 are cooperatively configured to direct a block copolymer deposited in the graphoepitaxy DSA directing confinement well 22 during phase separation to form an etchable feature that can be etch transferred to the semiconductor substrate 12. Additionally, the assisting etch resistant fill topographical features 24 and the corresponding assisting etch resistant fill confinement wells 26 are cooperatively configured to direct a block copolymer (BCP) deposited in the assisting etch resistant fill confinement wells 26 during phase separation to prevent, obstruct, or otherwise resist formation of etchable features to prevent etch transferring a feature(s) to the semiconductor substrate 12. In an exemplary embodiment, and as will be discussed in further detail below, the graphoepitaxy DSA directing confinement well 22 has a depth (indicated by double headed arrow 28) and a width (indicated by double headed arrow 30) that helps direct a block copolymer deposited thereon to phase separate to form an etchable feature, e.g., etchable cylinder. In an exemplary embodiment, and as will be discussed in further detail below, the assisting etch resistant fill confinement wells 26 have depths (indicated by double headed arrow 32) and widths (indicated by double headed arrow 34) that helps direct a block copolymer deposited thereon to phase separate to form an etch resistant feature, e.g., etch resistant plug.

Figure 4:
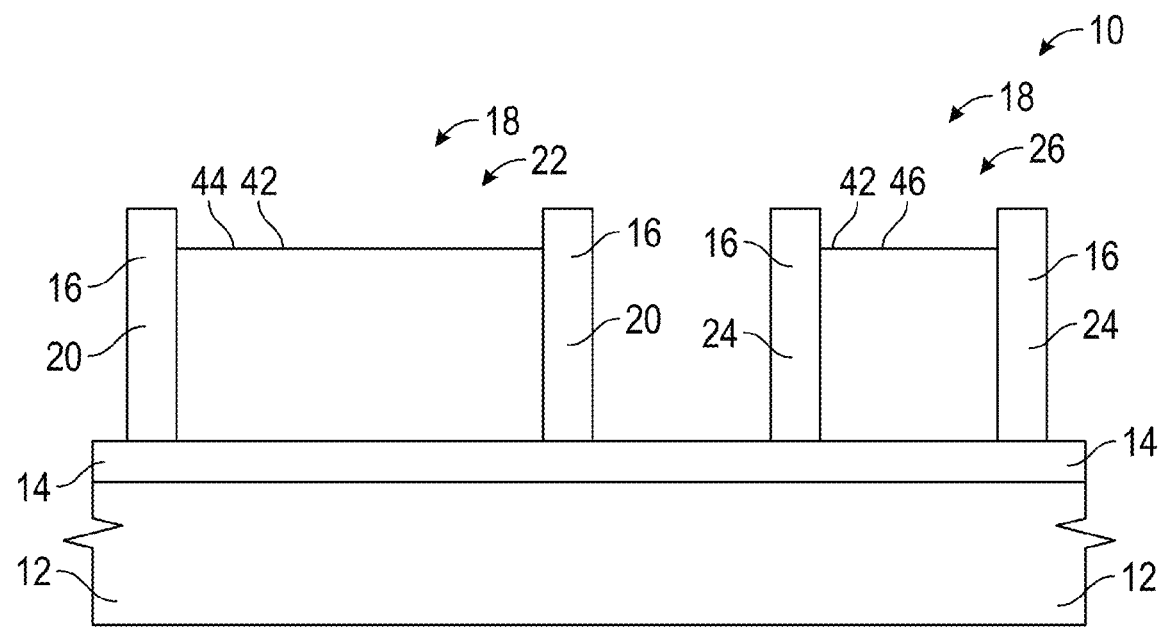
FIG. 4 illustrates, in cross-sectional view, an integrated circuit during a further advanced fabrication stage in accordance with an exemplary embodiment.

FIG. 4 illustrates, in cross-sectional view, the integrated circuit 10 during a further advanced fabrication stage in accordance with an exemplary embodiment. The process continues by depositing a block copolymer 42 into the confinement wells 18. In particular, the graphoepitaxy DSA directing confinement well 22 and the assisting etch resistant fill confinement well 26 are correspondingly filled with quantities 44 and 46 of the block copolymer 42. In an exemplary embodiment, the block copolymer 42 has A polymer blocks and B polymer blocks. Non-limiting examples of block copolymers include polystyrene-block-polymethylmethacrylate (PS-b-PMMA), polystyrene-block-polybutadiene (PS-b-PB), polystyrene-block-poly(2-vinyl pyridine (PS-b-P2VP), polystyrene-block-polydimethylsiloxane (OS-b-PDMS), and polystyrene-block-polyethylene oxide (PS-b-PEO). In an exemplary embodiment, the block copolymer 42 is deposited into the confinement wells 18 using a spin coating process or the like.

Figure 5:
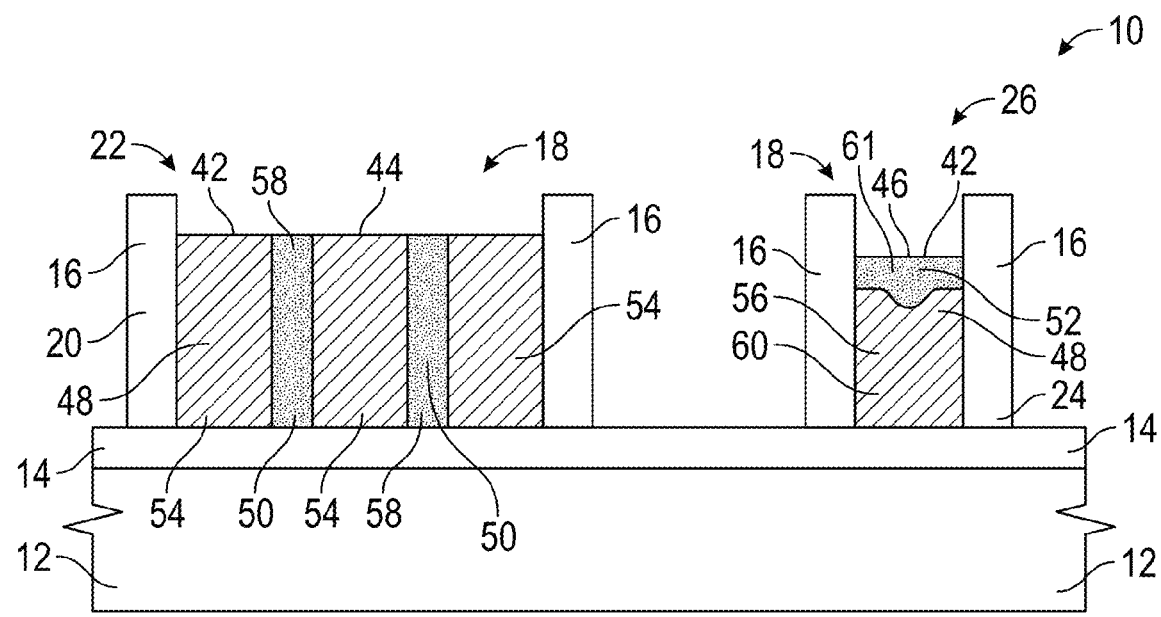
FIGS. 5-6 illustrate, in cross-sectional views, an integrated circuit during a further advanced fabrication stage in accordance with an exemplary embodiment.
Figure 6:
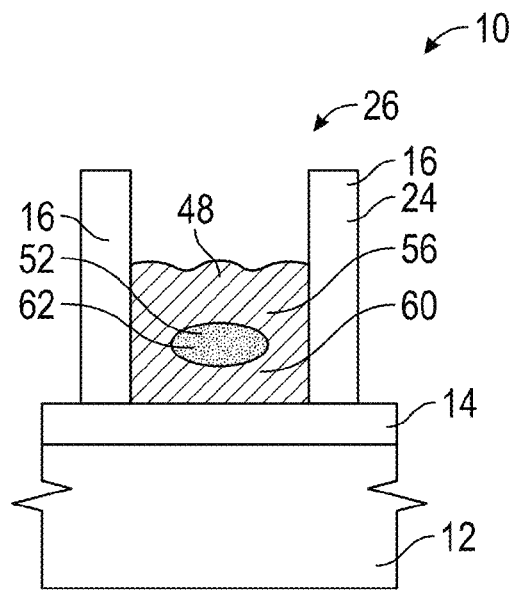

FIGS. 5-6 illustrate, in cross-sectional views, the integrated circuit 10 during a further advanced fabrication stage in accordance with an exemplary embodiment. As illustrated in FIG. 5, the block copolymer 42 is annealed, for example by either heating the block copolymer 42 at a predetermined temperature for a predetermined time or by applying an organic solvent such as methyl ethyl ketone (MEK), toluene, ethyl acetate, or the like to phase separate the block copolymer 42 and form a phase separated block copolymer 48. In an exemplary embodiment, the block copolymer 42 is heated at a predetermined temperature of from about 125 to about 350° C. for a predetermined time of from 1 minute to about 24 hours to form the phase separated block copolymer 48.

The phase separated block copolymer 48 (shown in FIGS. 5-6) has etchable phases 50 and 52 and etch resistant phases 54 and 56. Depending upon the particular block copolymer 42, the etchable phases 50 and 52 are formed from either the A polymer blocks or the B polymer blocks of the block copolymer 42 and the etch resistant phases 54 and 56 are formed from the other of the A polymer blocks or the B polymer blocks. In an exemplary embodiment, the block copolymer 42 is PS-b-PMMA (polystyrene-b-polymethylmethacrylate) and the etchable phases 50 and 52 are PMMA (polymethylmethacrylate) and the etch resistant phases 54 and 56 are PS (polystyrene). In an exemplary embodiment, the etchable phases 50 and 52 are the volume fraction minority phase of the block copolymer 42 (e.g., either the A polymer blocks or the B polymer blocks) and the etch resistant phases 54 and 56 are the volume fraction majority phase of the block copolymer 42 (e.g., the other of the A polymer blocks or the B polymer blocks).

In an exemplary embodiment and as illustrated on the left side of FIG. 5, the phase separated block copolymer 48 in the graphoepitaxy DSA directing confinement well 22 is spatially registered to the graphoepitaxy DSA directing features 20 to define a nanopattern that allows for resolution, for example, in the nanometer range beyond that of conventional optical lithography techniques. In particular and as illustrated, the quantity 44 of the block copolymer 42 in the graphoepitaxy DSA directing confinement well 22 is phase separated and the graphoepitaxy DSA directing features 20 direct the etchable phase 50 to extend longitudinally substantially through the graphoepitaxy DSA directing confinement well 22. In one example, the graphoepitaxy DSA directing features 20 direct the etchable phase 50 to form etchable cylinders 58 extending longitudinally substantially through the graphoepitaxy DSA directing confinement well 22.

In an exemplary embodiment and as illustrated on the right side of FIG. 5, the quantity 46 of the block copolymer 42 in the assisting etch resistant fill confinement well 26 is phase separated and the assisting etch resistant fill topographical features 24 direct the etch resistant phase 56 to obstruct the etchable phase 52 from extending longitudinally substantially through the assisting etch resistant fill confinement well 26. In an exemplary embodiment, the assisting etch resistant fill topographical features 24 direct the etch resistant phase 56 to form an etch resistant plug 60 underlying a portion 61 of the etchable phase 52 in the assisting etch resistant fill confinement well 26. In an exemplary embodiment and as illustrated of the right side of FIG. 5, the etch resistant plug 60 may be formed as a solid plug of the etch resistant phase 56 when the block copolymer 42 is phase separated in the assisting etch resistant fill confinement well 26 having the depth 32 (see FIG. 3) and/or the width 34 (see FIG. 3), depending upon the particular composition of the block copolymer 42, sized so as to direct such formation. FIG. 5 (right side) thus illustrates the formation of the etch resistant DSA result (that is, BCP phase separation occurring without forming an etchable cylinder) in the confinement well 26 of sufficiently small width, depending on the particular composition of the BCP. The width of the confinement well 26 resulting in such etch resistant DSA result can be determined by conducting parametric studies of the DSA in confinement wells covering a certain range of widths, either by means of computational simulations or experimentally.

In an alternative exemplary embodiment and as illustrated in FIG. 6, the etch resistant plug 60 may be formed as a plug of the etch resistant phase 56 surrounding a portion 62 of the etchable phase 52 when the block copolymer 42 is phase separated in the assisting etch resistant fill confinement well 26 having the depth 32 (see FIG. 3) and/or the width 34 (see FIG. 3), depending upon the particular composition of the block copolymer 42, sized so as to direct such formation. FIG. 6 thus illustrates the formation of the etch resistant DSA result (that is, BCP phase separation resulting in an internal cavity 62 filled with the minority etchable BCP phase and without forming an etchable cylinder) in the confinement well 26 of sufficiently large width, dependent on the particular composition of the BCP. It should be noted that the internal minority phase cavity 62 may have a variety of shapes, including, for example, a toroidal (doughnut-like) shape. The range of confinement well widths yielding etch resistant DSA result as shown on the right side of FIG. 4B can be determined by conducting parametric studies of the DSA in confinement wells covering a certain range of widths, either by means of computational simulations or experimentally.

Figure 7:
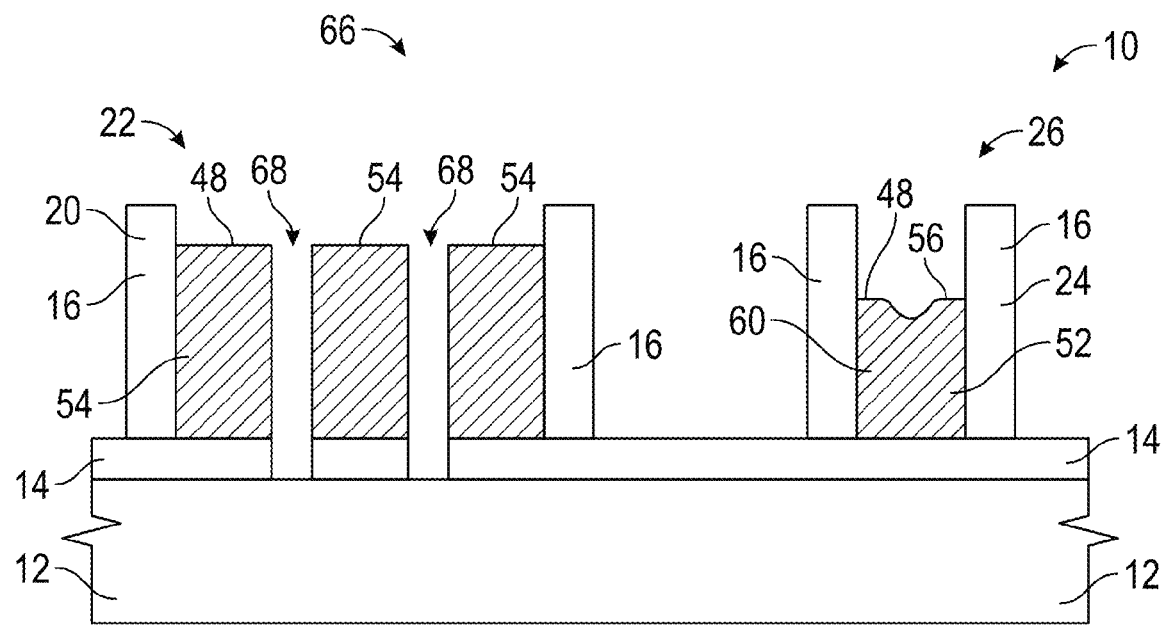
FIG. 7 illustrates, in cross-sectional view, an integrated circuit during a further advanced fabrication stage in accordance with an exemplary embodiment.
Figure 8:
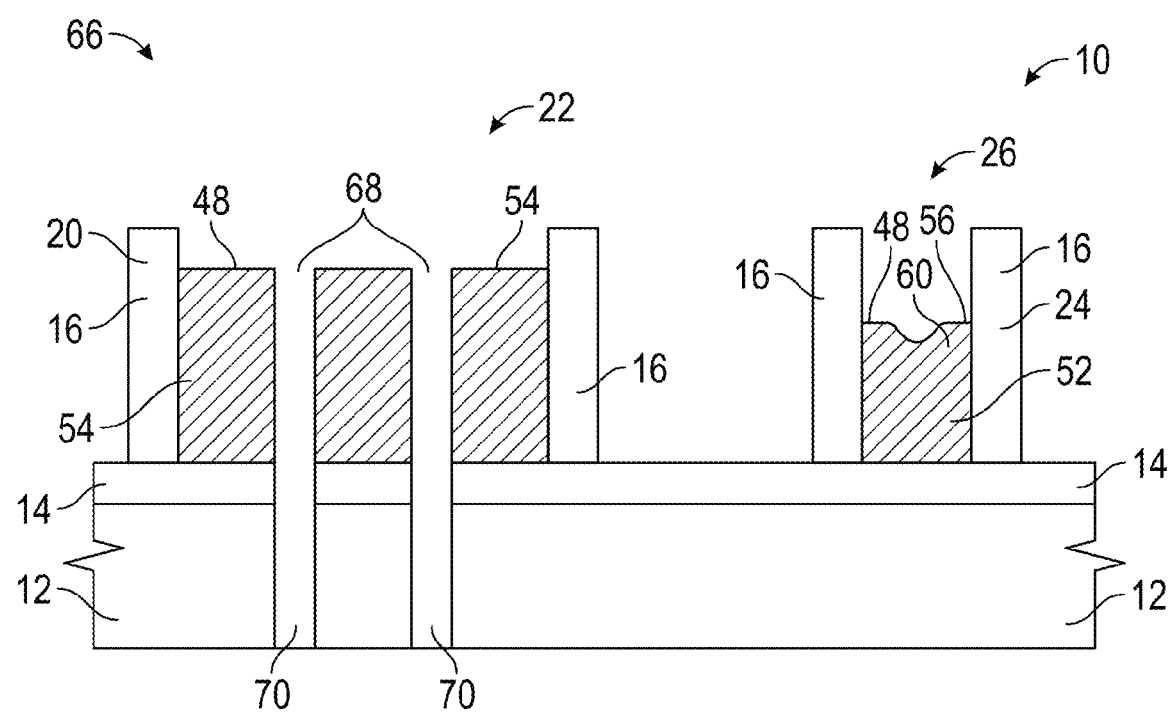
FIG. 8 illustrates, in cross-sectional view, an integrated circuit during a further advanced fabrication stage in accordance with an exemplary embodiment.

The process continues as illustrated in FIG. 7 by etching the phase separated block copolymer 48 to form an etch mask 66. In particular, the phase separated block copolymer 48 is etched to remove the etchable phase 50 (e.g., etchable cylinders 58 shown in FIG. 5) from the graphoepitaxy DSA directing confinement well 22 while substantially leaving the etch resistant phase 54 to define openings 68. In the assisting etch resistant fill confinement well 26, the portion 61 of the etchable phase 52 (shown in FIG. 5) is removed to expose the etch resistant plug 60, which substantially obstructs further etching of the etchable phase 52 that underlies the etch resistant plug 60. As such, the etch resistant plug 60 prevents formation of a continuous opening through the phase separated block copolymer 48 disposed in the assisting etch resistant fill confinement well 26. In an exemplary embodiment, the etch mask 66 is formed by exposing the phase separated block copolymer 48 to a dry etching process, such as reactive-ion etching (RIE) plasma, that selectively etches the etchable phases 50 and 52 while substantially leaving the etch resistant phases 54 and 56 intact. As illustrated in FIG. 8, using the etch mask 66, the openings 68 are etch transferred to the semiconductor substrate 12 to form openings 70 without etch transferring any features from the assisting etch resistant fill confinement well 26 to the semiconductor substrate 12. In an exemplary embodiment, the openings 70 are formed using a conventional wet or dry etching process.

Figure 9:
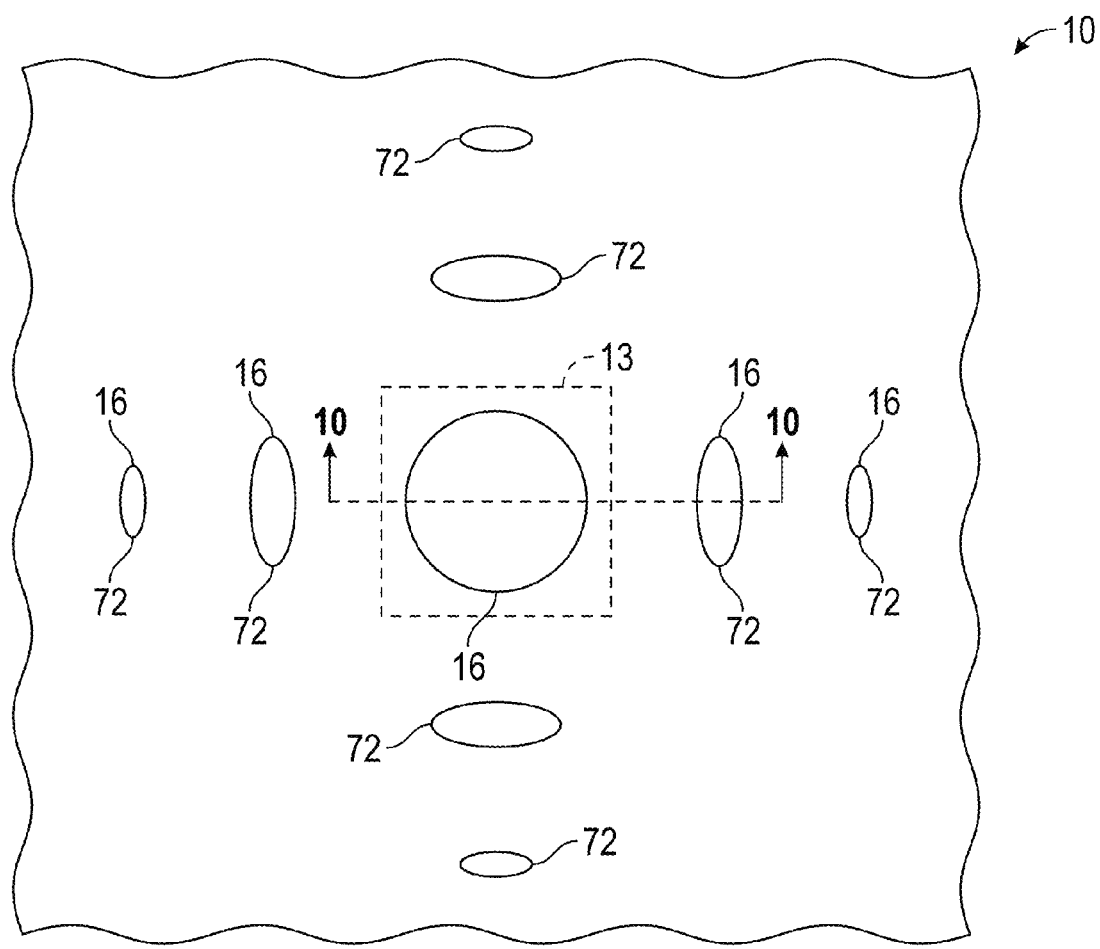
FIG. 9 illustrates, in top view, an integrated circuit during an intermediate fabrication stage in accordance with another exemplary embodiment.

With reference to FIG. 9, in an alternative embodiment, a DSA enhanced source mask optimization (SMO) is described. Similar to assist features, the DSA enhanced SMO considers the DSA process within SMO as part of a cost function. A generic cost function for source and mask optimization can be written as minimization of root mean square or maximum error through litho process conditions. In addition, a cost component can be added to add a penalty for assist features and side-lobe printing. Side-lobes 72 are patterns printed overlying the semiconductor substrate 12 at the locations with no lithographically corresponding mask features but typically about a main mask feature (DSA directing lithographically-printable mask feature 13) that has been printed overlying the semiconductor substrate 12 as discussed above. Side-lobes 72 manifest where ringing intensity variations are created by the interference. Currently, this cost penalty is based on lithographic patterning. Litho side-lobes 72 naturally occur based on the light source shaped and act similar to assist features. State of the art SMO tries to eliminate the side-lobes 72, which degrades the process window. For example, a penalty based on the transferability of the assist features and side-lobes 72 may be used. Side-lobes 72 may improve the process window if the solution is not restricted to eliminating side-lobes printing. A generic cost function for source and mask optimization is given in equation (Eq.) 1. In Eq. 1, the total cost is written as summation of all the cost with respect to process variation such as dose (d), focus (f), and mask (m). In addition to these cost components, an assist feature/side-lobe print cost (p) is added. Note that the underlying method is not limited by only these process variations but they are mentioned here as examples. Here, the assist feature/side-lobe printing is a function of litho process. In an exemplary embodiment, a novel printing cost as formulated in equation (Eq.) 2, which is a function of the DSA process, is used.

$$C = \Sigma_{d,f,m} \alpha_i C_i(\mathrm{LITHO}(d,f,m)) - C_p(\mathrm{LITHO}) \quad (1)$$

$$C = \Sigma_{d,f,m} \alpha_i C_i(\mathrm{LITHO}(d,f,m)) + C_v(\mathrm{DSA}) \quad (2)$$

A DSA assisting confinement well and side-lobe print checking model can be incorporated into optical proximity correction/reticle enhancement techniques (OPC/RET) and OPC verification tools. A simple form of this model is a look-up table that maps the assist feature size to DSA transferable/not-transferable result. Another form of the model can be an empirical model that can be calibrated against experimental data. Traditional assist feature printing checks in OPC only checks if an assist feature is printing or not without looking at their shapes. Assist features for DSA need to get the actual shapes and/or dimensions of printing assist features in litho to make sure that they don't print during the DSA process.

There are commercially available tools to generate litho assist features and perform SMO. These tools usually contain a control parameter to control the level of assist feature and/or side-lobe printing. Some examples of these tools are Calibre® from Mentor Graphics, Tachyon™ from ASML, Proteus™ from Synopsys, and PPC Tools™ from Cadence Design Systems.

Figure 10:
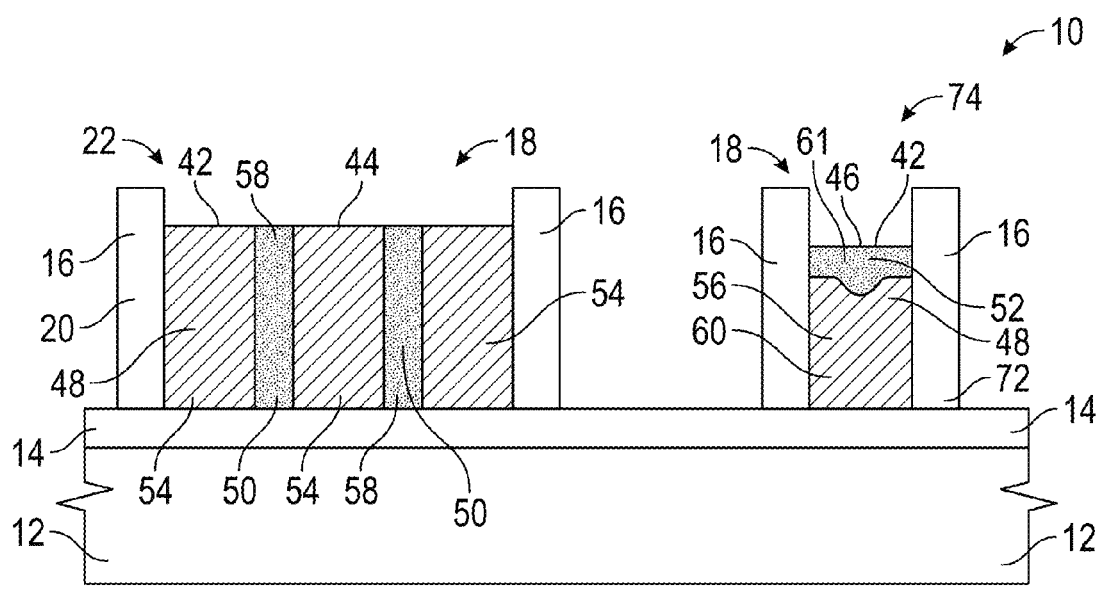
FIG. 10 illustrates, in cross-sectional view, an integrated circuit during a further advanced fabrication stage in accordance with an exemplary embodiment.

In an exemplary embodiment and with reference to FIGS. 9-10, using the DSA techniques as discussed above, the side-lobes 72 form topographical features 16 (e.g., via selectively etching a patterned photoresist layer to form side-lobe etch resistant fill topographical features) that form confinement wells 18 as side-lobe etch resistant fill confinement wells 74 that are similarly configured as the assisting etch resistant fill confinement wells 26 as discussed above. Next, the side-lobe etch resistant fill confinement wells 74 are filled with a block copolymer 42 and phase separated to form an etchable phase 52 and an etch resistant phase 56 that defines an etch resistant plug 60. As such, the side-lobes 72 are configured so as to not form any unintended device features in the integrated circuit.

EXAMPLE

Figure 11:
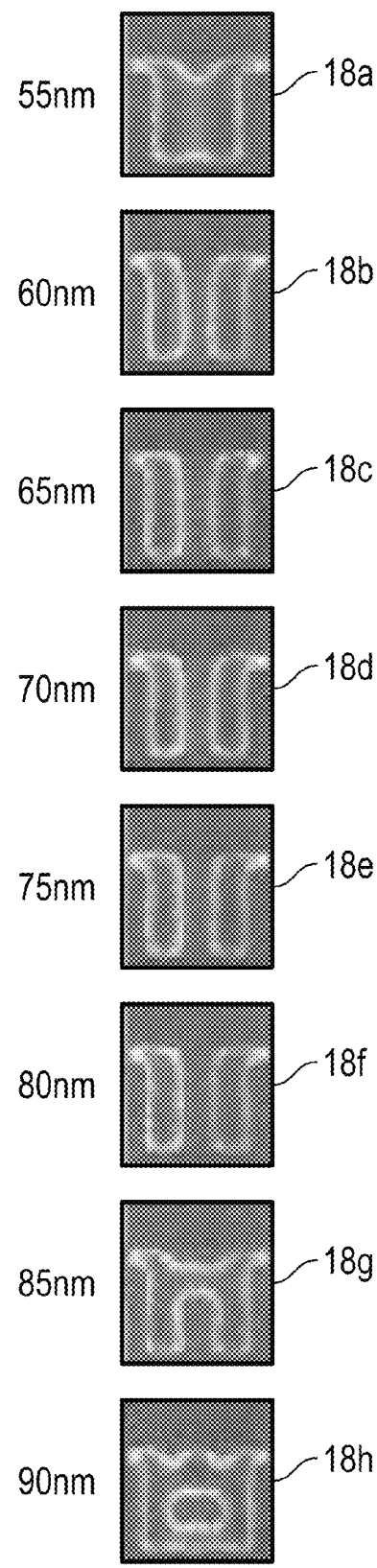
FIG. 11 is an example of computational simulations for determining the dimensions of topographical features and corresponding confinement wells in accordance with an exemplary embodiment.

FIG. 11 is an example of computational simulations for determining the dimensions of topographical features and corresponding confinement wells in accordance with an exemplary embodiment. The example is provided for illustration purposes only and is not meant to limit the various embodiments in any way.

To simulate graphoepitaxy DSA patterns, a masking method referenced in *Exploration of the Directed Self-Assembly Based Nano-Fabrication Design Space Using Computational Simulations* by Azat Latypov et al. is used to model confinement of block copolymers in a three-dimensional simulation domain and is incorporated herein by reference in its entirety. The BCP used for the simulation was PS-b-PMMA with a volume fraction of a PS phase of f=0.7, a degree of polymerization of N=663, and an unperturbed radius of gyration of $R_g$=10 nm. The depth of the confinement wells 18a-h was set to 50 nm and the widths of the confinement wells 18a-h were varied from 55 to 90 nm. As illustrated, the confinement wells 18b-f having widths of from 60 nm to 80 nm formed an etchable DSA cylinder of PMMA and the confinement wells 18a and 18g-h formed etch resistant plugs of PS. As such, in this example, confinement wells having widths of 55 nm or less, or alternatively, widths of 85 to 90 nm were sized to facilitate forming an etch resistant plug, whereas confinement wells having widths of from 60 to 80 nm were sized to facilitate forming an etchable cylinder. It should be noted that similar results can be obtained experimentally by those skilled in the art by forming families of confinement wells with likewise varying widths and/or depths and performing the DSA process with one or more compositions of block copolymer.

Accordingly, methods for fabricating integrated circuits including assisting lithographically-printable mask features for directed self-assembly to improve the directed self-assembly process window have been described.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
    forming assisting etch resistant fill topographical features that overlie a semiconductor substrate and that define an assisting etch resistant fill confinement well using a photomask that defines an assisting lithographically-printable mask feature;

depositing a block copolymer into the assisting etch resistant fill confinement well; and phase separating the block copolymer into an etchable phase and an etch resistant phase defining a phase separated block copolymer, wherein the assisting etch resistant fill topographical features direct the etch resistant phase to form an etch resistant plug in the assisting etch resistant fill confinement well, and wherein the method further comprises etching the phase separated block copolymer to remove at least a portion of the etchable phase and the etch resistant plug obstructs etching continuously through the phase separated block copolymer such that an opening does not extend fully through the phase separated block copolymer that is in the assisting etch resistant fill confinement well.

2. The method of claim 1, wherein phase separating comprises forming the etch resistant plug extending laterally substantially across the assisting etch resistant fill confinement well.

3. The method of claim 1, wherein phase separating comprises forming the etch resistant plug surrounding a portion of the etchable phase.

4. The method of claim 1, wherein forming the assisting etch resistant fill topographical features comprise forming the assisting etch resistant fill confinement well having a predetermined depth that facilitates directing formation of the etch resistant plug.

5. The method of claim 4, wherein forming the assisting etch resistant fill topographical features comprise forming the assisting etch resistant fill confinement well having the predetermined depth defined by computational simulations.

6. The method of claim 4, wherein forming the assisting etch resistant fill topographical features comprise forming the assisting etch resistant fill confinement well having the predetermined depth defined experimentally.

7. The method of claim 1, wherein forming the assisting etch resistant fill topographical features comprise forming the assisting etch resistant fill confinement well having a predetermined width that facilitates directing formation of the etch resistant plug.

8. The method of claim 7, wherein forming the assisting etch resistant fill topographical features comprise forming the assisting etch resistant fill confinement well having the predetermined width defined by computational simulations.

9. The method of claim 7, wherein forming the assisting etch resistant fill topographical features comprise forming the assisting etch resistant fill confinement well having the predetermined width defined experimentally.

10. The method of claim 1, wherein depositing the block copolymer comprises depositing the block copolymer having a volume fraction minority phase and a volume fraction majority phase.

11. The method of claim 10, wherein phase separating the block copolymer comprises phase separating the block copolymer into the volume fraction majority phase as the etch resistant phase.

12. The method of claim 10, wherein phase separating the block copolymer comprises phase separating the block copolymer into the volume fraction minority phase as the etchable phase.

13. A method for fabricating an integrated circuit comprising:
lithographically transferring a DSA directing lithographically-printable mask feature and an assisting lithographically-printable mask feature from a photomask to a photoresist layer that overlies a semiconductor substrate for correspondingly forming graphoepitaxy DSA directing features that define a graphoepitaxy DSA directing confinement well and assisting etch resistant fill topographical features that define an assisting etch resistant fill confinement well;

filling the graphoepitaxy DSA directing confinement well with a first quantity of a block copolymer;

filling the assisting etch resistant fill confinement well with a second quantity of the block copolymer;

phase separating the first quantity of the block copolymer into a first etchable phase and a first etch resistant phase, wherein the graphoepitaxy DSA directing features direct the first etchable phase to extend longitudinally substantially through the graphoepitaxy DSA directing confinement well; and phase separating the second quantity of the block copolymer into a second etchable phase and a second etch resistant phase, wherein the assisting etch resistant fill topographical features direct the second etch resistant phase to obstruct the second etchable phase from extending longitudinally substantially through the assisting etch resistant fill confinement well.

14. The method of claim 13, wherein phase separating the first quantity of the block copolymer comprises directing the first etchable phase to form an etchable cylinder that extends longitudinally substantially through the graphoepitaxy DSA directing confinement well.

15. The method of claim 13, further comprising:
depositing a neutral brush layer overlying the semiconductor substrate, wherein lithographically transferring comprises forming the graphoepitaxy DSA directing features and the assisting etch resistant fill topographical features overlying the neutral brush layer.

16. The method of claim 13, wherein phase separating the second quantity of the block copolymer comprises directing the second etch resistant phase with the assisting etch resistant fill topographical features to form an etch resistant plug, and wherein the method further comprises:
etching the block copolymer after phase separating the first and second quantities to remove the first etchable phase from the graphoepitaxy DSA directing confinement well to form a first opening while obstructing etching of the second quantity of the block copolymer with the etch resistant plug to prevent forming an opening through the assisting etch resistant fill confinement well, thereby defining an etch mask.

17. The method of claim 16, further comprising:
etching a second opening into the semiconductor substrate using the etch mask, wherein the second opening is aligned with the first opening.

18. The method of claim 13, wherein lithographically transferring comprises exposing the photomask to a light source to lithographically transfer the DSA directing lithographically-printable mask feature and the assisting lithographically-printable mask feature to the photoresist layer.

19. The method of claim 18, wherein lithographically transferring comprises exposing the photomask to a direct ultraviolet light source.

20. A method for fabricating an integrated circuit comprising:
patterning a photoresist layer that overlies a semiconductor substrate using a photomask that defines a DSA directing lithographically-printable mask feature;

selectively etching the patterned photoresist layer to form a plurality of topographical features including graphoepitaxy DSA directing features that lithographically correspond to the DSA directing lithographically-printable mask feature and side-lobe etch resistant fill topographical features, wherein the graphoepitaxy DSA directing features define a graphoepitaxy DSA directing confinement well and the side-lobe etch resistant fill topographical features define a side-lobe etch resistant fill confinement well;

depositing a block copolymer into the graphoepitaxy DSA directing confinement well and the side-lobe etch resistant fill confinement wells; and phase separating the block copolymer into an etchable phase and an etch resistant phase, wherein the side-lobe etch resistant fill topographical features direct the etch resistant phase to form an etch resistant plug in the side-lobe etch resistant fill confinement well and the graphoepitaxy DSA directing features direct the etchable phase to extend longitudinally substantially through the graphoepitaxy DSA directing confinement well.

* * * * *